United States Patent
Garney et al.

(10) Patent No.: US 6,925,015 B2
(45) Date of Patent: Aug. 2, 2005

(54) STACKED MEMORY DEVICE HAVING SHARED BITLINES AND METHOD OF MAKING THE SAME

(75) Inventors: John I. Garney, Portland, OR (US); David G. Chow, Los Altos, CA (US); Rick Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 10/305,588

(22) Filed: Nov. 26, 2002

(65) Prior Publication Data

US 2004/0100828 A1 May 27, 2004

(51) Int. Cl.[7] .............................................. G11C 11/34
(52) U.S. Cl. .................. 365/189.02; 257/295
(58) Field of Search ....................... 365/189.02; 257/295

(56) References Cited

U.S. PATENT DOCUMENTS

| | | | | |
|---|---|---|---|---|
| 2,027,798 A | | 1/1936 | Watt ........................ 192/48.6 |
| 4,646,266 A | * | 2/1987 | Ovshinsky et al. ......... 365/105 |
| 5,877,054 A | * | 3/1999 | Yamauchi ................... 438/264 |
| 5,969,380 A | * | 10/1999 | Seyyedy ...................... 257/295 |
| 5,973,953 A | * | 10/1999 | Yamashita et al. ............ 365/63 |
| 6,004,825 A | | 12/1999 | Seyyedy ......................... 438/3 |
| 6,034,882 A | * | 3/2000 | Johnson et al. ............. 365/103 |
| 6,388,917 B2 | * | 5/2002 | Hoffmann et al. .......... 365/158 |
| 6,473,336 B1 | * | 10/2002 | Nakajima et al. ........... 365/171 |
| 6,501,111 B1 | * | 12/2002 | Lowrey ....................... 257/295 |
| 6,515,888 B2 | * | 2/2003 | Johnson et al. ............. 365/130 |
| 6,819,581 B2 | * | 11/2004 | Ito .............................. 365/145 |

* cited by examiner

*Primary Examiner*—Michael Tran
(74) *Attorney, Agent, or Firm*—Lanny L. Parker

(57) ABSTRACT

Briefly, in accordance with one embodiment of the invention, a system includes a memory array. The memory array comprises a first layer of memory cells overlying a second layer of memory cells and bit lined coupled to at least one memory cell in the first layer of memory cells and to at least one memory cell in the second layer of memory cell.

20 Claims, 5 Drawing Sheets

STACKED MEMORY DEVICE HAVING SHARED BITLINES AND METHOD OF MAKING THE SAME

BACKGROUND

Ferroelectric memories are typically comprised of a material having ferroelectric properties sandwiched between layers of electrodes. The electrodes are typically arranged in an x-y grid, with each cell of the array being located at the points in the ferroelectric materials where the x and y lines cross over each other. The data bit stored in each cell has a value determined by the polarity of the ferroelectric material at that point. The polarity is controlled by application of voltages on the x and y lines. Typically, the x lines are referred to as word lines and the y lines are referred to as bit lines. However, the size or the array (i.e. the size of the x-y grid) is often dependent upon the resistance of the bit lines Thus, there is a continuing need for better ways to arrange ferrolectric or polymer memories.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1:
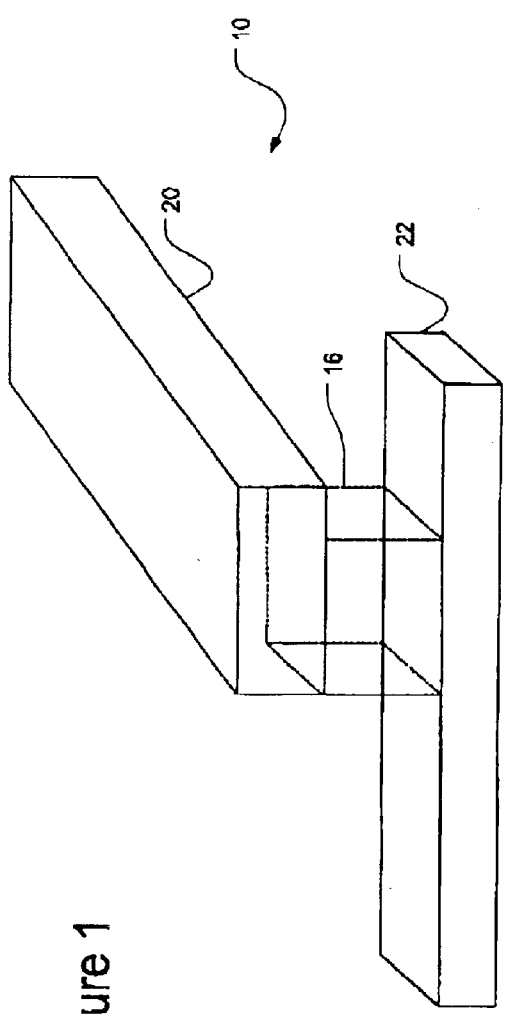
FIG. 1 shows an example of a ferroelectric memory cell in accordance with an embodiment.

FIG. 1 shows one example of a cell in a ferroelectric memory array in accordance with a particular embodiment of the present invention. Memory cell 10 may include an electrode layer 22, a ferroelectric material layer 16 and a second electrode layer 20. Ferroelectric material layer 16 may comprise on or more layers of materials such as, for example, various polymers such as, but not limited to, polyvinyl and polyethylene fluorides, polyvinyledene fluoride (PVDF) polymer, polyvinyl and polyethylene chlorides, polyacrylonitriles, polyamides, polyfluorides, copolymers thereof, and combinations thereof. Although it should be understood that the scope of the present invention is not limited to polymers comprising one or more of the materials listed above.

This cell may be manufactured by depositing and patterning a layer of conductive material such as for example, a material comprising copper, aluminum, titanium, etc. to form electrode 22. Thereafter, one or more polymer/ferroelectric material layer(s) may be deposited, and then another layer of conductive material may be deposited and patterned to form electrode 20. Although it should be understood that the scope of the present invention is not limited to a particular cell structure or manufacturing technique, in this particular embodiment electrode layers 20 and 22 may be organized such that one forms a series of lines oriented in a first direction and the other forms a series of lines in a direction approximately orthogonal to the first direction.

Although these lines are separated by the ferroelectric material, they do cross over forming the grid of memory cells. The region of ferroelectric material 16 sandwiched between the two lines at the crossover point shown in FIG. 1 may generally be referred to as the portion of the cell that holds the data value as will be discussed in more detail further. It should be understood that in alternative embodiments, electrodes 20 and 22 may comprise a variety of conductive layers and need not be patterned orthogonal to each other.

Figure 2:
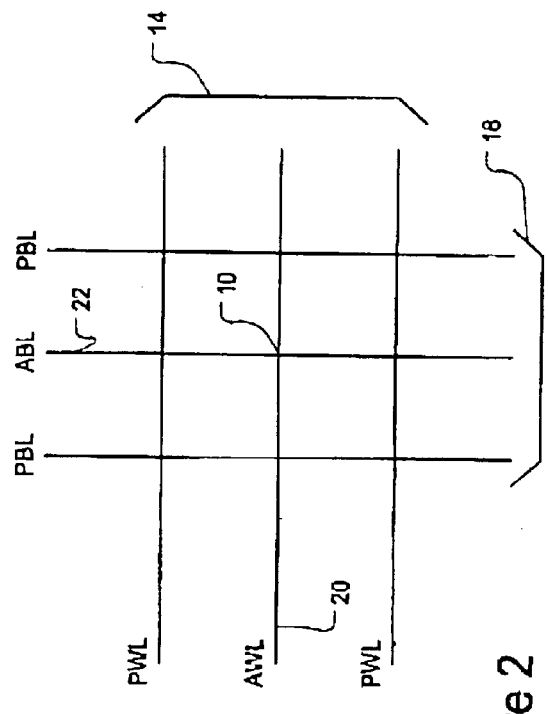
FIG. 2 is an schematic representation of an embodiment of an array of memory cells in accordance with an embodiment.

FIG. 2 is a schematic representation of a portion of a memory array formed of such cells. The line providing electrode 20 of FIG. 1 may be referred to as a word line and the line providing electrode 22 as a bit line. Cell 10 may be located at the cross over point (i.e. intersection) of these two lines and in this example is referred to as the active cell. The active cell for the purposes here may be that cell being addressed in a memory operation, for example, a memory read or a memory write, although the scope of the present invention is not limited in this respect. Correspondingly, the word line 20 may be referred to as the active word line (AWL) and bit line 22 as the active bit line (ABL). The word and bit lines surrounding the active cell may be referred to as passive word lines (PWL) and passive bit lines (PBL).

The data value stored in the cell in this particular embodiment may represent a binary value such as either a one '1' or a zero '0'. However, in alternative embodiments, the value stored may represent 3 or more states, such as, for example, in a multi-level memory cell. The value of the cell may be determined by the polarization of the material versus the voltage being applied.

Figure 3:
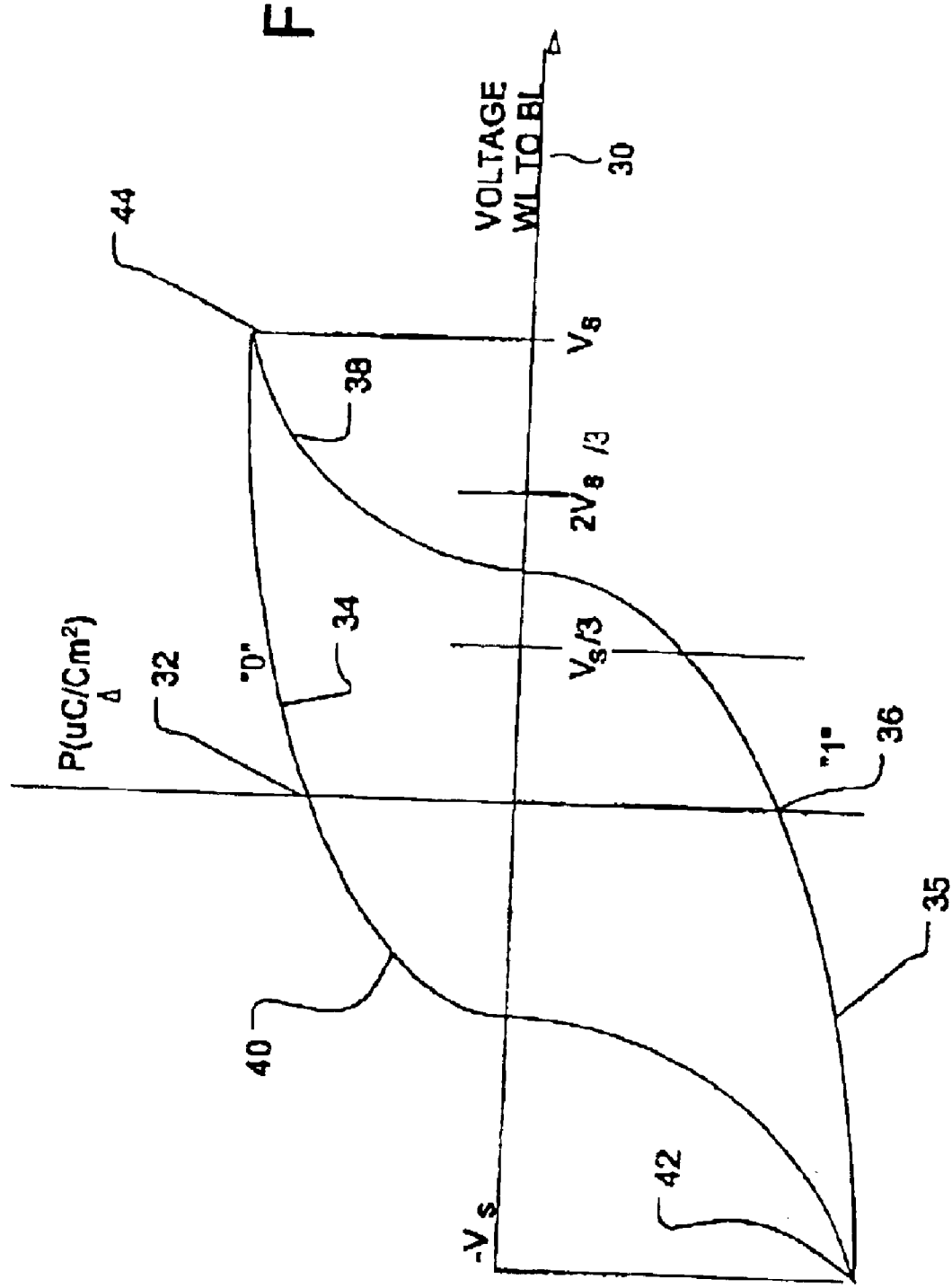
FIG. 3 shows an embodiment of a voltage versus polarization hysterisis curve in accordance with an embodiment.

FIG. 3 is a graph illustrating a polarization versus voltage hysterisis curve to demonstrate the nature of an embodiment of memory cell 10 and how it may store data values of ones or zeros, although it should be understood that the scope of the present invention is not limited in this respect. Changes in the relative voltage potential applied between the active word line and active bit line may result in the material experiencing a polarization shift or change in polarization. The differential voltage potential applied to the cell may be referred to as the word line to bit line voltage potential, and is shown in the curve of FIG. 3 as the horizontal axis. The vertical axis may represent the polarization of the material. The origin of the axes may correspond to zero voltage potential and zero polarization.

When a negative voltage potential $-V_s$ is applied to the word line 20 relative to bit line 22, the polarization versus voltage profile may follow the left path 40. This may occur as the polarization of the ferroelectric material switches from positive to negative polarity. The polarization may settle at the polarization level corresponding to the negative saturation voltage $-V_s$, as shown at the bottom of the leftmost path at 42. When the magnitude of the applied voltage is reduced, shown here as being reduced to zero along path 35, the material may retain a remnant polarity shown as a data value one on the vertical axis at 36.

Similarly, when a positive saturation voltage potential $V_s$ is applied to word line 20 relative to bit line 22, the polarization versus voltage profile may follow the right side path 38, settling at the polarization level corresponding to the positive saturation voltage, as shown at the top of the rightmost path at 44. When the applied voltage is reduced, shown here as being reduced to zero along path 34, the remnant polarity may represent a "zero" data value on the vertical axis shown at 32.

To determine the current state of polarity of a cell, the switching voltage $V_s$ may be applied to the ferroelectric cell (e.g. memory cell 10). This may be represented as a word line to bit line voltage differential, $V_s$. Application of the voltage potential may result in a polarization shift. For the data value zero, where the cell has positive polarity at zero voltage, application of the saturation voltage may produce little to no charge out. Sense amplifiers assigned to that cell detect some charge release, but not nearly as much as from cells having negative polarity at zero voltage. This lack of charge release may then used to produce a data value of 'zero' for that memory cell in the read operation.

However, application of the saturation voltage to the cells having negative polarity at zero voltage does may result in a polarity reversal and an associated charge release. This charge release is sensed and manipulated to produce a data value of 'one' for that memory cell in the read operation. Although the scope of the present invention is not limited in this respect, some polymer materials may experience a destructive read as the value stored (i.e. the polarity of the material) may be changed during the read operation. Due to the destructive read nature of some polymer memory cells, it may be desirable to provide a voltage potential to memory cells in the array that are not being read so as to reduce the chance of disturbing the value stored in those cells, although the scope of the present invention is not limited in this respect. For example, a voltage potential that is half, one-third or even less or the read voltage potential may be applied to cells that are not being accessed. In yet other embodiments, a negative voltage potential may be applied.

It should be understood that the scope of the present invention is not limited to memory arrays having memory cells that exhibit the operational characteristics shown in FIG. 3. In alternative embodiments, other polymer or ferroelectric materials may exhibit different characteristics. In addition, the scope of the present invention is not limited to memories that rely solely on the polarization of molecules to represent data values of a memory cell. In other embodiments, memory cells that vary the resistance, capacitance, or any combination of these may be used.

Figure 4:
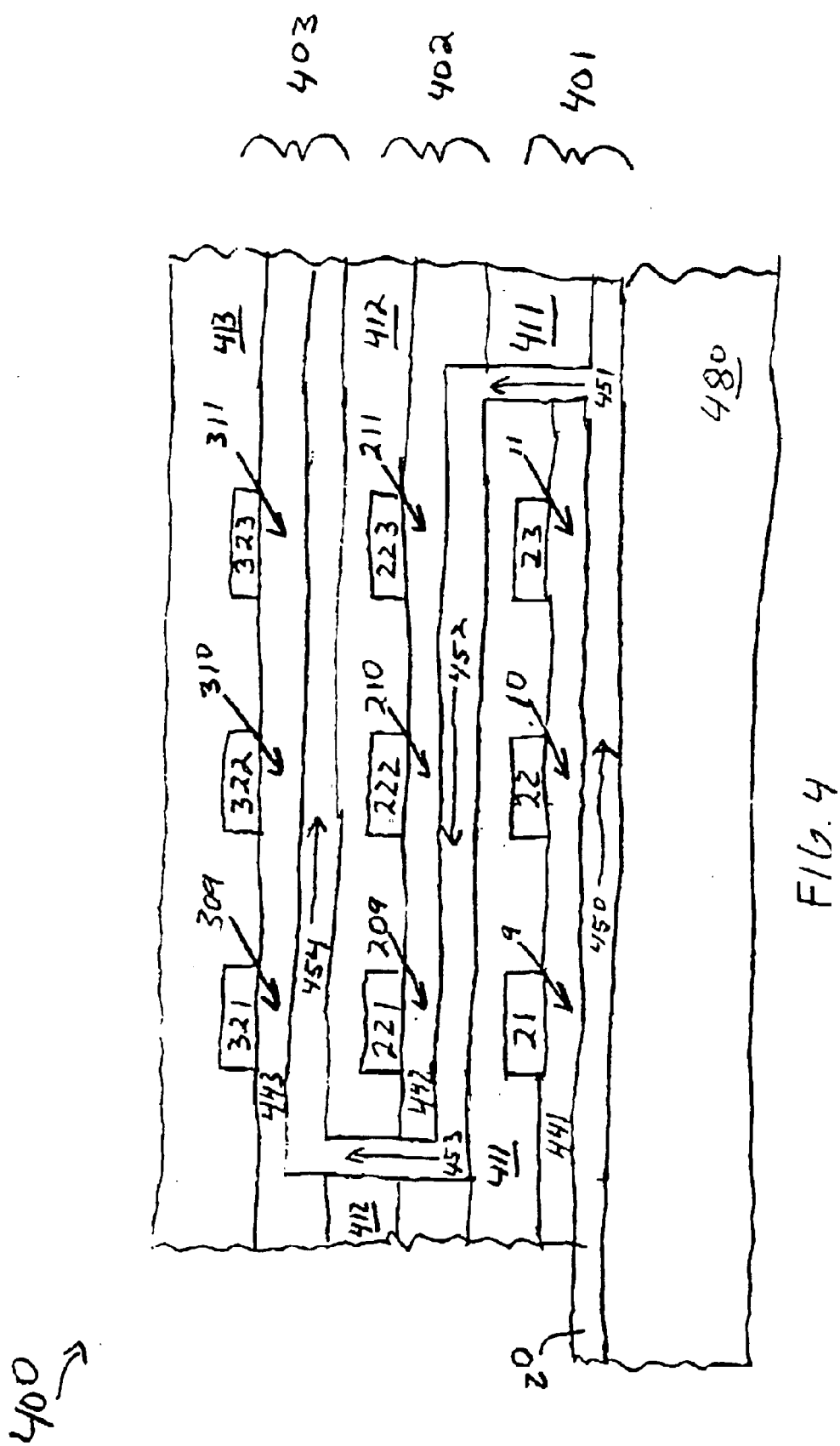
FIG. 4 is a cross-sectional schematic of a stacked memory array in accordance with an embodiment.

Turning to FIG. 4, an example of how layers of memory cells may be stacked upon each other is explained. Although the scope of the present invention is not limited in this respect, layers of memory cells may be stacked over each other to form a stacked memory array 400 over a substrate 480. For example, memory array 400 may comprise a lower layer of memory cells 401, a middle layer of memory cells 402, and an upper layer of memory cells 403. Although the particular embodiment of FIG. 3 illustrates three stacked layers of memory cells, the scope of the present invention is not limited in this respect. Alternative embodiments may comprise just two layers of memory cells or four or more layers of memory cells as desired.

As shown, layer of memory cells 401 may include memory cells 9–11 formed with a layer of ferrolectric material 441 between bit line 20 and word lines 21–22. Layer of memory cells 402 may include memory cells 209–211 formed with a layer of ferroelectric material 442 between bit line 20 and word lines 221–223. Layer of memory cells 403 may include memory cells 309–311 formed with a layer of ferroelectric material 443 between bit line 20 and word lines 321–323. It should be understood that the scope of the present invention is not limited to a particular number memory cells in a particular layer of memory cells.

Only three memory cells are shown so as not to obscure the present invention. In alternative embodiments memory array 400 may comprise multiple layers of memory cells with the layers of memory cells having tens, hundreds, or even thousands of memory cells. Further, in the particular embodiment shown in FIG. 4, layers of memory cells 401–403 are aligned such that the individual memory cells are overlying each other such that the cells of one layer is directly over the cells of another. It should be understood that the scope of the present invention is not limited in this respect and layers of memory cells 401–403 may only partially overlap each other, if at all.

Although the scope of the present invention is not limited in this respect, FIG. 4 is drawn to show how bit line 20 may be used to enable one or more memory cells on different layers of memory cells. In this particular embodiment, bit line 20 traverses across layer of memory cells 401, indicated with arrow 450, up to layer or memory cells 402, indicated with an arrow 451, across layer of memory cell 402, indicated with an arrow 452, up to layer of memory cells 403, indicated with an arrow 453, and across layer of memory cells 403, indicated with an arrow 454. Thus, in this particular embodiment, bit line 20 may have a serpentine path through the layers of memory array 400.

It should be understood that bit line 20 is illustrated in FIG. 4 as a contiguous line of conductive material just to represent that bit line 20 is electrically connected and conductive through layers of memory cells 401–403. During the manufacture of memory array 400, bit line 20 may be formed from different conductive materials that are in contact with each other. For example, the portion of bit line 20 traversing upward from layer or memory cells 401 to layer of memory cells 402 may comprise a contact formed through a dielectric layer 411. In alternative embodiments, the contact may include multiple layers of conductive material or may be formed segments of conductive material that are formed and patterned individually to provide bit line 20.

In addition, it should also be understood that memory array 400 may comprise other layers or materials not shown in FIG. 4 and the scope of the present invention is not limited so as to require all the layers shown. For example, memory array 400 shown in FIG. 4 includes dielectric layers 411–412 that may be used to provide electrical isolation between layers of memory cells 401–403. Although the scope of the present invention is not limited in this respect, electrical insulation may be provided by multiple layers of non-conductive material. It should also be understood that the scope of the present invention is not limited to memory arrays that are arranged or fabricated in the manner indicated in FIG. 4. FIG. 4 is meant to illustrate how in particular embodiments, a bit line may routed through a stacked memory array to enable memory cells on different layers. FIG. 4 may not illustrate all the layers or materials used in the fabrication of memory array 400 so as not to obscure the present invention.

Figure 5:
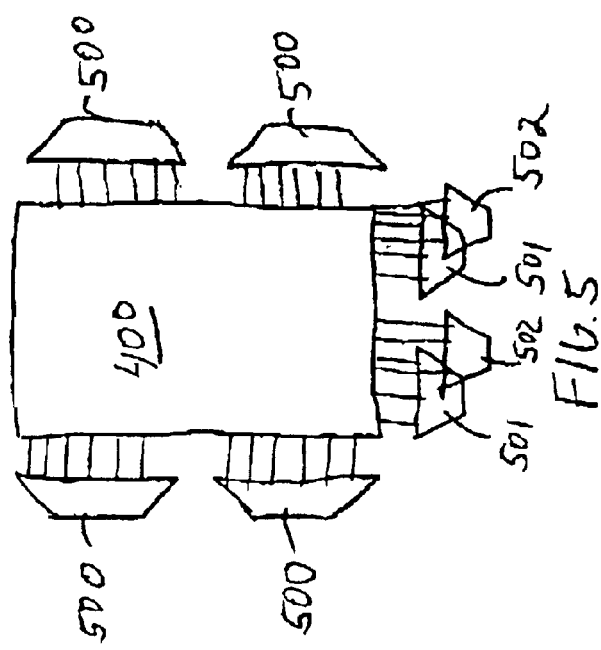
FIG. 5 is a block diagram of a stacked memory array in accordance with an embodiment.

FIG. 5 is provided to further illustrate how the same bit line may be used to connect to cells on different layers. FIG. 5 illustrates how multiplexors 500 may be used to provide bit lines used to access memory array 400. Although the scope of the present invention is not limited in this respect, multiplexors 500 may use all or a portion of the address and/or control signal lines to determine which bit lines are to be enabled. The bit lines may then provide a read voltage potential to memory cells on different layers within memory array 400. Word line multiplexors or multiplexors 501–502 may be used to provide the appropriate voltage potentials on the word lines to the various layers within memory array 400 (e.g. word lines 21–23, 221–223, or 321–323).

For example, multiplexors 502 may provide the appropriate voltage potential onto the word lines so that a memory cell (e.g. cell 210 of FIG. 4) on the second layer of memory cells 402 may be accessed. In addition, multiplexors 501 and 502 may apply voltage potentials onto the word lines corresponding to the memory cells that are not being accessed so as to reduce the chance of disturbing the value stored in those cells. It should be understood that in alternative embodiments, word lines may traverse more than one layer of memory cells and may enable cells on different layers within memory array 400. It should also be understood that the scope of the present invention is not limited by the number or particular arrangement of multiplexors used to provide the bit line and word line signals to memory array 400.

Figure 6:
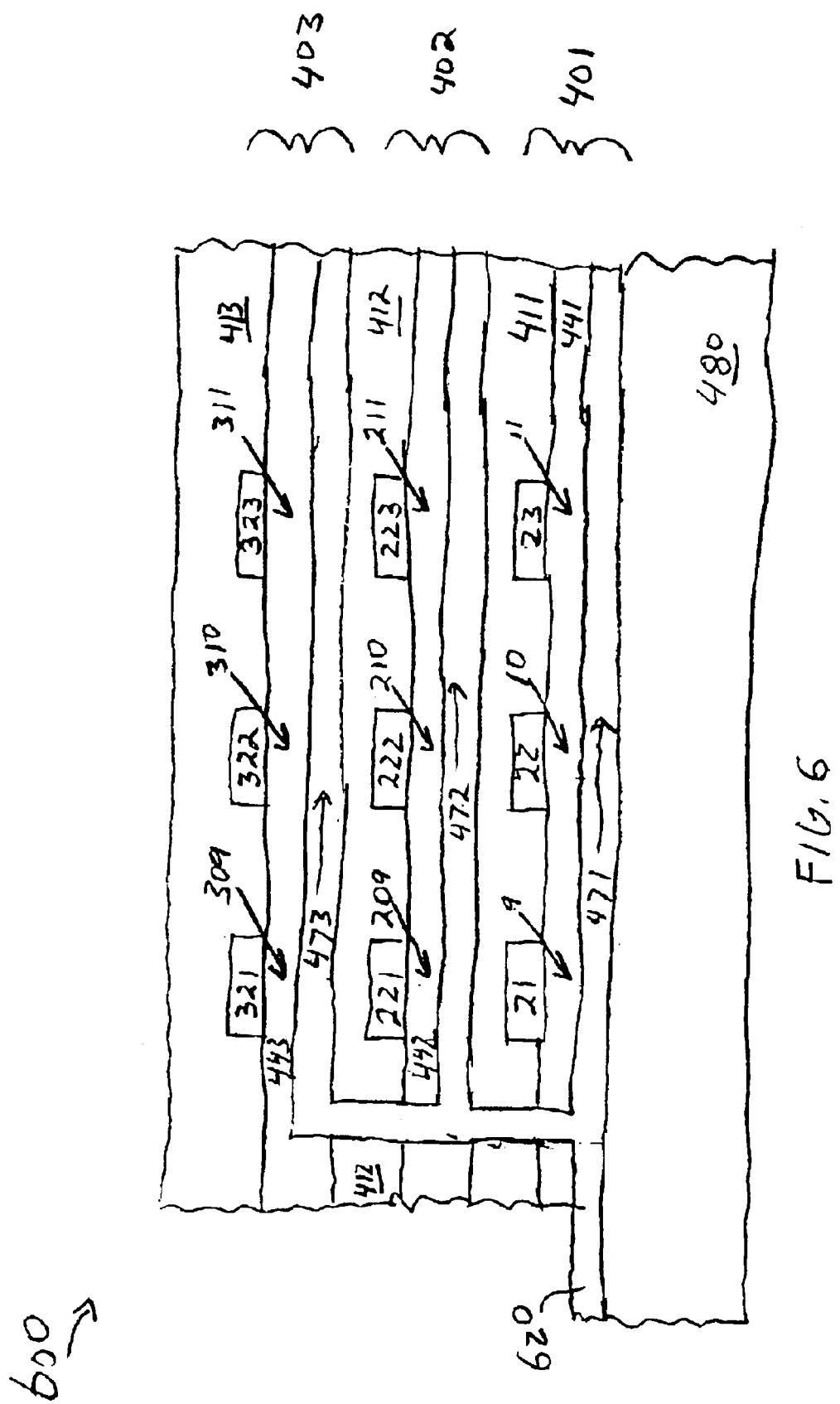
FIG. 6 is a cross-sectional schematic of a stacked memory array in accordance with an alternative embodiment.

Turning to FIG. 6, an alternative embodiment for a stacked memory array is provided. In this particular embodiment, cells (e.g. cells 21–23, 221–223, and 32–323) may be enabled by a bit line 620. Instead of traversing layers of memory cells 401–403 in a serpentine pattern, bit line 620 may traverse along one or more side of memory array 600 and have branches (indicated in FIG. 6 with arrows 471–473) that are electrically connected together. Although FIG. 6 illustrates that bit line 620 traverse upward along the leftmost side of memory array 600, the scope of the present invention is not limited in this respect. In alternative embodiments, the bit line may traverse upward along other sides as well and be physically connect to all or a sub-set of the branches traversing across layers of memory cells 401–403.

Figure 7:
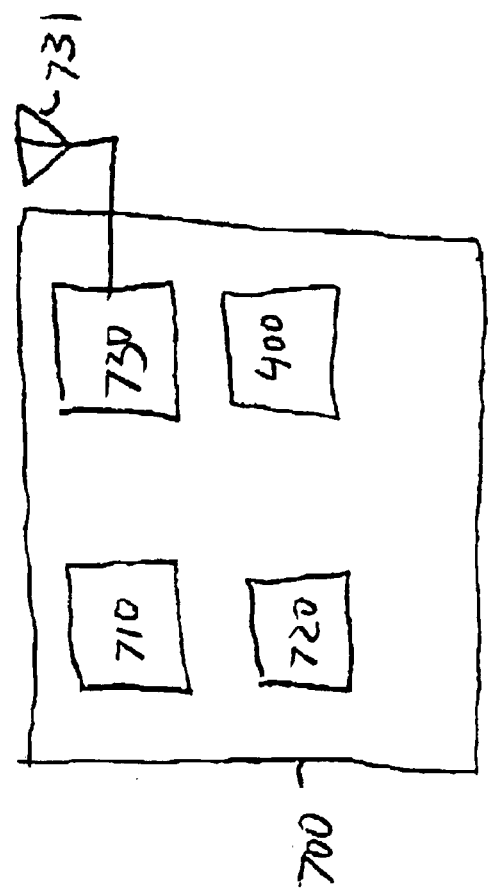
FIG. 7 is a block diagram of a wireless computing device in accordance with an embodiment.

FIG. 7 is provided to illustrate an example of an application for memory array 400 in accordance with the present invention. Although the present invention is not limited in this respect, memory array 400 may be used as a stand alone memory that is used in a portable communication device 700 such as a mobile communication device (e.g., cell phone), a two-way radio communication system, a one-way pager, a two-way pager, a personal communication system (PCS), a portable computer, or the like. Alternatively, memory array 400 may be used in applications that are not regarded as mobile such as desk top computing systems. Although it should be understood that the scope and application of the present invention is in no way limited to these examples.

Wireless computing device 700 may comprise a processor 710 to execute instructions and comprise a microprocessor, a central processing unit (CPU), a digital signal processor, a microcontroller, a reduced instruction set computer (RISC), a complex instruction set computer (CISC), or the like. Wireless computing device 700 may also optionally include a display 720 to display information to a user, and a transceiver 730 and antenna 731 to provide wireless communication. It should also be understood that the scope of the present invention is not limited to stand alone memories. In alternative embodiments, memory array 400 may be formed within or embedded in other components of wireless computing device 700 such as in processor 710.

It should be understood that although FIGS. 5 and 6 illustrate embodiments having three layers of memory cells, the scope of the present invention is not limited in this respect. In alternative embodiments, the layers of memory cells may be grouped together in groups of two or more layers (i.e. bilayers, trilayers, etc) and/or the memory array may comprise multiple groups of layers. In such embodiments, each bilayer or group of layers may have different bit lines connected to each layer of memory cells in that group, but the same bit lines may be electrically connected to together such that different groups of layers (e.g. different bilayers) share the same bit lines. In yet other embodiments, bit lines may be used to connect the layers of memory cells in different groups of bilayers. For example, one bit line may be used to connect to memory cells in odd layers in the bilayers, while another bit line is used to connect to memory cells in the even layers in the bilayers. It should also be understood that in other embodiments, bit lines may connect to different layers in the bilayers or groups of layers.

It should also be understood that although the embodiments described herein discuss sharing bitlines with two or more layers or bilayers and separate word lines to each of the layers, the scope of the present invention is not limited in this respect. In alternative embodiments, word lines may be shared with multiple layers of memory cells or with bilayers of memory cells, and electrically separate bit lines may be used to connect to the memory cells of the layers of memory cells.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
   a first layer of memory cells;
   a second layer of memory cells;
   a third layer of memory cells; and
   a bit line conductively connecting the memory cells in the first, second and third layers.

2. The apparatus of claim 1, further comprising:
   a first word line coupled to the first memory cell in the first layer of memory cells;
   a second word line coupled to the first memory cell in the second layer of memory cells; and
   a third word line coupled to the first memory cell in the third layer of memory cells.

3. The apparatus of claim 1, wherein at least a portion of the second layer of memory cells is overlying at least a portion of the first layer of memory cells.

4. The apparatus of claim 3, wherein the first memory cell of the second layer of memory cells is directly over the first memory cell of the first layer of memory cells.

5. The apparatus of claim 1, wherein the bit line comprises a first branch, a second branch, and a third branch, the first branch traversing at least a portion of the first layer of memory cells, the second branch traversing at least a portion of the second layer of memory cells, and the third branch traversing at least a portion of the third layer of memory cells.

6. The apparatus of claim 5, wherein the bit line traverses across at least a portion of the first layer of memory cells, up to the second layer of memory cells, and then across at least a portion of the second layer of memory cells.

7. The apparatus of claim 6, wherein the bit line further traverses up to the third layer of memory cells and then across at least a portion of the third layer of memory cells.

8. The apparatus of claim 6, wherein the bit line traverses across to all the memory cells in the second layer of memory cells.

9. The apparatus of claim 1, wherein the bit line comprises a first branch and a second branch, the first branch traversing at least a portion of the first layer of memory cells and the second branch traversing at least a portion of the second layer of memory cells.

10. The apparatus of claim 2, further comprising:
a first multiplexer to provide a voltage potential to the first word line; and
a second multiplexer to provide a voltage potential to the second word line.

11. The apparatus of claim 10, wherein the first multiplexer provides a read voltage potential to the word line and second multiplexer provides a voltage potential that is at least half of the read voltage potential when a first memory cell of the first layer of memory cells is read.

12. The apparatus of claim 11, wherein the first layer of memory cells comprises a memory cell including a layer of ferroelectric material.

13. The apparatus of claim 12, wherein the ferroelectric material is selected from the group comprising polyethylene fluorides, polyvinyledene fluoride (PVDF) polymer, polyethylene chlorides, polyacrylonitriles, and polyamides.

14. The apparatus of claim 1, further comprising a processor, and wherein the first layer of memory cells and the second layer of memory cells provides a memory array coupled to the processor.

15. The apparatus of claim 14, wherein the memory array is embedded in the processor.

16. The apparatus of claim 1, further comprising a layer of dielectric material between the first layer of memory cells and the second layer of memory cells.

17. A wireless computing device comprising:
a transceiver;
a memory array comprising:
a first layer of memory cells;
a second layer of memory cells; and
a bit line to enable a first memory cell in the first layer of memory cells and
a second first memory cell in the second layer of memory cells; and
a processor coupled to the transceiver and the memory array.

18. The wireless computing device of claim 17, further comprising:
a first word line coupled to the first memory cell in the first layer of memory cells; and
a second word line coupled to the first memory cell in the second layer of memory cells.

19. The wireless computing device of claim 17, wherein the memory array further comprises a third layer of memory cells, wherein the bit line is further coupled to enable a first memory cell of the third layer of memory cells.

20. The wireless computing device of claim 19, wherein the bit line comprises a first branch, a second branch, and a third branch, the first branch traversing at least a portion of the first layer of memory cells, the second branch traversing at least a portion of the second layer of memory cells, and the third branch traversing at least a portion of the third layer of memory cells.

* * * * *